US010573801B2

(12) United States Patent
Shigyou et al.

(10) Patent No.: US 10,573,801 B2
(45) Date of Patent: Feb. 25, 2020

(54) PIEZOELECTRIC LINEAR ACTUATOR, PIEZOELECTRICALLY DRIVEN VALVE, AND FLOW RATE CONTROL DEVICE

(71) Applicant: FUJIKIN INCORPORATED, Osaka (JP)

(72) Inventors: Kohei Shigyou, Osaka (JP); Takashi Hirose, Osaka (JP); Kouji Nishino, Osaka (JP); Ryousuke Dohi, Osaka (JP); Naofumi Yasumoto, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 219 days.

(21) Appl. No.: 15/751,422

(22) PCT Filed: Aug. 9, 2016

(86) PCT No.: PCT/JP2016/003671
§ 371 (c)(1),
(2) Date: Feb. 8, 2018

(87) PCT Pub. No.: WO2017/033423
PCT Pub. Date: Mar. 2, 2017

(65) Prior Publication Data
US 2018/0240961 A1    Aug. 23, 2018

(30) Foreign Application Priority Data
Aug. 21, 2015    (JP) .................. 2015-164201

(51) Int. Cl.
*H01L 41/09*    (2006.01)
*H01L 41/053*    (2006.01)
(Continued)

(52) U.S. Cl.
CPC ............ *H01L 41/09* (2013.01); *F16K 31/004* (2013.01); *F16K 31/007* (2013.01);
(Continued)

(58) Field of Classification Search
CPC ............ Y10T 137/7661; F16K 31/007; F16K 31/008; F16K 31/004; F16K 37/005;
(Continued)

(56) References Cited

U.S. PATENT DOCUMENTS 5,145,147 A * 9/1992 Nakazawa ............ F16K 31/007
                                                    251/11
5,669,408 A * 9/1997 Nishino ................ G05D 7/0635
                                                    137/487.5
(Continued)

FOREIGN PATENT DOCUMENTS

EP    0 749 058 A2    12/1996
JP    H08-338546 A    12/1996
(Continued)

OTHER PUBLICATIONS

International Search Report issued in PCT/JP2016/003671; dated Oct. 11, 2016.

*Primary Examiner* — Jessica Cahill
(74) *Attorney, Agent, or Firm* — Studebaker & Brackett PC

(57)    ABSTRACT

A piezoelectric linear actuator comprising a laminated piezoelectric actuator having a cylindrical shape; a lower support member supporting the laminated piezoelectric actuator and extending laterally to the left and right of the laminated piezoelectric actuator; a pair of displacement transfer members extending along the left and right sides of the laminated piezoelectric actuator, respectively, to slidably intersect the lower support member and transferring displacement due to the piezoelectric effect of the laminated piezoelectric actuator; and an output part locked to the pair of displacement transfer members below the lower support member and coupling lower end portions of the displacement transfer members, wherein the pair of displacement transfer members are formed to have a width dimension that
(Continued)

is the same or substantially the same as the width dimension of the laminated piezoelectric actuator.

21 Claims, 11 Drawing Sheets

(51) Int. Cl.
| | |
|---|---|
| *F16K 37/00* | (2006.01) |
| *F16K 31/00* | (2006.01) |
| *H02N 2/04* | (2006.01) |
| *H01L 41/04* | (2006.01) |
| *H02N 2/06* | (2006.01) |
| *H01L 41/083* | (2006.01) |

(52) U.S. Cl.
CPC .......... *F16K 37/005* (2013.01); *H01L 41/042* (2013.01); *H01L 41/053* (2013.01); *H02N 2/04* (2013.01); *H02N 2/06* (2013.01); *H01L 41/083* (2013.01)

(58) Field of Classification Search
CPC ..... H01L 41/042; H01L 41/053; H01L 41/23; H01L 41/25; H01L 41/09; H01L 41/083; H02N 2/04; H02N 2/06
See application file for complete search history.

(56) References Cited

U.S. PATENT DOCUMENTS

| | | | |
|---|---|---|---|
| 8,181,932 B2* | 5/2012 | Matsumoto | F16K 7/14 |
| | | | 251/129.02 |
| 8,729,774 B2* | 5/2014 | Moler | H01L 41/053 |
| | | | 310/328 |
| 10,247,326 B2* | 4/2019 | Schupp | F16K 31/008 |
| 2011/0139271 A1* | 6/2011 | Hirata | G05D 7/0635 |
| | | | 137/487.5 |
| 2011/0315905 A1 | 12/2011 | Hirose et al. | |
| 2012/0273061 A1* | 11/2012 | Hidaka | F16K 7/14 |
| | | | 137/334 |
| 2016/0363231 A1* | 12/2016 | Yasumoto | F16K 7/14 |

FOREIGN PATENT DOCUMENTS

| | | |
|---|---|---|
| JP | 2003-120832 A | 4/2003 |
| JP | 2010-151698 A | 7/2010 |

\* cited by examiner

PIEZOELECTRIC LINEAR ACTUATOR, PIEZOELECTRICALLY DRIVEN VALVE, AND FLOW RATE CONTROL DEVICE

TECHNICAL FIELD

The present invention relates to a piezoelectric linear actuator using a laminated piezoelectric actuator, a piezoelectrically actuated valve equipped with the piezoelectric linear actuator, and a flow controller equipped with the piezoelectrically actuated valve.

BACKGROUND ART

Conventionally, as an actuation member of a linear actuator or an actuation member of a valve, a laminated piezoelectric actuator formed by laminating piezoelectric elements has often been used, and flow controllers that control the flow with a piezoelectrically actuated valve using a laminated piezoelectric actuator are also known.

As an example of a flow controller of this type, a flow controller 30 shown in FIG. 23 is configured such that a valve element 33, such as a metal diaphragm valve, interposed in a flow channel 32 inside a body 31 can be operated to open and close with a laminated piezoelectric actuator 34 attached to the body 31 (Patent Documents 1 to 3, etc.).

The flow controller 30 shown in FIG. 23 is called a pressure-type flow controller. When a so-called critical expansion condition of $(P_1/P_2) \geq$ about 2 is maintained between the pressure $P_2$ on the downstream side and the pressure $P_1$ on the upstream side of an orifice 35 interposed in the flow channel 32, the gas flow rate Q through the orifice 35 is represented by $Q=KP_1$ (wherein K is a constant).

Utilizing this relation, the upstream-side pressure $P_1$ detected by a pressure detector 36 is feedback-controlled using the valve on the upstream side, whereby the flow rate Q can be controlled with high accuracy. Further, excellent characteristics can be exerted in that even when there is a significant change in the pressure of the gas on the upstream side of the valve element 33, the controlled flow value hardly changes. The highly accurate control of the upstream-side pressure $P_1$ can be achieved by a piezoelectrically actuated valve using the laminated piezoelectric actuator 34, which has excellent responsiveness.

CITATION LIST

Patent Literature

Patent Document 1: Japanese Laid-Open Patent Publication No. 2003-120832
Patent Document 2: Japanese Laid-Open Patent Publication No. H8-338546
Patent Document 3: Japanese Laid-Open Patent Publication No. 2010-151698

SUMMARY OF INVENTION

Technical Problem

In recent years, particularly in the field of semiconductor manufacturing devices, smaller gas supply systems have been demanded. Accordingly, also for valves and flow controllers forming gas supply systems, downsizing has been required.

However, the thrust necessary for the opening and closing operation of a valve is determined by conditions including the flow, pressure, and the like of the gas flowing through the valve. Therefore, laminated piezoelectric actuators cannot be simply downsized, which has inhibited overall downsizing of flow controllers.

Thus, the main object of the present invention is, while using a conventional laminated piezoelectric actuator, to provide a thinned piezoelectric linear actuator, a downsized piezoelectrically actuated valve equipped with the piezoelectric linear actuator, and also a downsized flow controller equipped with the piezoelectrically actuated valve.

Solution to Problems

In order to achieve the above object, a first aspect of the piezoelectric linear actuator according to the present invention is a piezoelectric linear actuator including:

a laminated piezoelectric actuator having a cylindrical shape;

a lower support member supporting the laminated piezoelectric actuator and extending laterally to the left and right of the laminated piezoelectric actuator;

a pair of displacement transfer members extending along the left and right sides of the laminated piezoelectric actuator, respectively, to slidably intersect the lower support member and transferring displacement due to the piezoelectric effect of the laminated piezoelectric actuator; and an output part locked to the pair of displacement transfer members below the lower support member and coupling lower end portions of the displacement transfer members.

The piezoelectric linear actuator is characterized in that the displacement transfer members are each in the form of an elongated member having an arc-shaped inner peripheral surface along the outer peripheral surface of the laminated piezoelectric actuator and also having side surfaces continuous to the arc-shaped inner peripheral surface, in the lower end portion of each of the displacement transfer members, a vertically long guide hole, through which the lower support member is inserted, is formed in such a manner that the guide holes are in opposed positions, the output part is locked to a lower-side inner peripheral edge portion of each of the guide holes, the output part includes a cylindrical part having an upper end portion inserted between the lower end portions of the pair of displacement transfer members and a pair of arm parts formed on the outer peripheral surface of the cylindrical part to protrude along the lower support member and each locked to the lower-side inner peripheral edge portion of each of the guide holes of the pair of displacement transfer members, and the pair of displacement transfer members are formed to have a width dimension that is the same or substantially the same as the width dimension of the laminated piezoelectric actuator.

A second aspect of the piezoelectric linear actuator according to the present invention is characterized in that in the first aspect, the lower-side inner peripheral edge portion of each of the guide holes of the pair of displacement transfer members serves as a locking part to which each of the arms of the output part is locked, and, in the lower surface of each of the arm parts of the output part, a locking groove having the same shape as the locking part and detachably fitted with the locking part and positioned is formed.

A third aspect of the piezoelectric linear actuator according to the present invention is characterized in that in the second aspect, the locking parts and the locking grooves have arc shapes that are located on the circumference of a common circle in plan view.

A fourth aspect of the piezoelectric linear actuator according to the present invention is characterized in that in the first aspect, the piezoelectric linear actuator further includes a bonnet to which the lower support member is coupled, the bonnet having formed therein:

a concave portion receiving the lower end portions of the pair of displacement transfer members, an upper portion of the cylindrical part, the pair of arm parts, and an elastic body; and a through-hole into which a lower portion of the cylindrical part is slidably inserted.

A fifth aspect of the piezoelectric linear actuator according to the present invention is characterized in that in the fourth aspect, the output part is slidably supported by the through-hole through an annular sealing member fitted into an annular groove formed in the lower outer peripheral surface of the cylindrical part.

A sixth aspect of the piezoelectric linear actuator according to the present invention is characterized in that in the fourth aspect, the bonnet is formed to have a dimension that is the same or substantially the same as the width dimension of the laminated piezoelectric actuator.

A first aspect of the piezoelectrically actuated valve according to the present invention includes:

a piezoelectric linear actuator including: a laminated piezoelectric actuator having a cylindrical shape; a lower support member supporting the laminated piezoelectric actuator and extending laterally to the left and right of the laminated piezoelectric actuator; a pair of displacement transfer members extending along the left and right sides of the laminated piezoelectric actuator, respectively, to slidably intersect the lower support member and transferring displacement due to the piezoelectric effect of the laminated piezoelectric actuator; and an output part locked to the pair of displacement transfer members below the lower support member and coupling lower end portions of the displacement transfer members, and being configured such that: the displacement transfer members are each in the form of an elongated member having an arc-shaped inner peripheral surface along the outer peripheral surface of the laminated piezoelectric actuator and also having side surfaces continuous to the arc-shaped inner peripheral surface; in the lower end portion of each of the displacement transfer members, a vertically long guide hole, through which the lower support member is inserted, is formed in such a manner that the guide holes are in opposed positions; the output part is locked to a lower-side inner peripheral edge portion of each of the guide holes; the output part includes a cylindrical part having an upper end portion inserted between the lower end portions of the pair of displacement transfer members and a pair of arm parts formed on the outer peripheral surface of the cylindrical part to protrude along the lower support member and each locked to the lower-side inner peripheral edge portion of each of the guide holes of the pair of displacement transfer members; and the pair of displacement transfer members are formed to have a width dimension that is the same or substantially the same as the width dimension of the laminated piezoelectric actuator;

a body to which the piezoelectric linear actuator is attached and having formed therein a flow channel;

a valve stem serving also as the output part of the piezoelectric linear actuator; and a valve element opening and closing the flow channel by operating the valve stem.

A second aspect of the piezoelectrically actuated valve according to the present invention is characterized in that in the first aspect of the piezoelectrically actuated valve, the lower-side inner peripheral edge portion of each of the guide holes of the pair of displacement transfer members serves as a locking part to which each of the arms of the output part is locked, and, in the lower surface of each of the arm parts of the output part, a locking groove having the same shape as the locking part and detachably fitted with the locking part and positioned is formed.

A third aspect of the piezoelectrically actuated valve according to the present invention is characterized in that in the second aspect of the piezoelectrically actuated valve, the locking parts and the locking grooves have arc shapes that are located on the circumference of a common circle in plan view.

A fourth aspect of the piezoelectrically actuated valve according to the present invention is characterized in that in the first aspect of the piezoelectrically actuated valve, the piezoelectrically actuated valve further includes a bonnet to which the lower support member is coupled, the bonnet having formed therein:

a concave portion receiving the lower end portions of the pair of displacement transfer members, an upper portion of the cylindrical part, the pair of arm parts, and an elastic body; and a through-hole into which a lower portion of the cylindrical part is slidably inserted.

A fifth aspect of the piezoelectrically actuated valve according to the present invention is characterized in that in the fourth aspect of the piezoelectrically actuated valve, the output part is slidably supported by the through-hole through an annular sealing member fitted into an annular groove formed in the lower outer peripheral surface of the cylindrical part.

A sixth aspect of the piezoelectrically actuated valve according to the present invention is characterized in that in the fourth aspect of the piezoelectrically actuated valve, the bonnet is formed to have a dimension that is the same or substantially the same as the width dimension of the laminated piezoelectric actuator.

A seventh aspect of the piezoelectrically actuated valve according to the present invention is characterized in that in the first aspect of the piezoelectrically actuated valve, the valve element is a metal diaphragm valve element.

A first aspect of the flow controller according to the present invention includes:

a piezoelectrically actuated valve; and a controller controlling the opening and closing of the piezoelectrically actuated valve, the piezoelectrically actuated valve including:

a piezoelectric linear actuator including: a laminated piezoelectric actuator having a cylindrical shape; a lower support member supporting the laminated piezoelectric actuator and extending laterally to the left and right of the laminated piezoelectric actuator; a pair of displacement transfer members extending along the left and right sides of the laminated piezoelectric actuator, respectively, to slidably intersect the lower support member and transferring displacement due to the piezoelectric effect of the laminated piezoelectric actuator; and an output part locked to the pair of displacement transfer members below the lower support member and coupling lower end portions of the displacement transfer members, and being configured such that: the displacement transfer members are each in the form of an elongated member having an arc-shaped inner peripheral surface along the outer peripheral surface of the laminated piezoelectric actuator and also having side surfaces continuous to the arc-shaped inner peripheral surface; in the lower end portion of each of the displacement transfer members, a vertically long guide hole, through which the lower support member is inserted, is formed in such a manner that the guide holes are in opposed positions; the output part is locked to a lower-side inner peripheral edge portion of each of the guide holes; the output part includes a cylindrical part having an upper end portion inserted between the lower end portions of the pair of displacement transfer members and a pair of arm parts formed on the outer peripheral surface of the cylindrical part to protrude along the lower support member and each locked to the lower-side inner peripheral edge portion of each of the guide holes of the pair of displacement transfer members; and the pair of displacement transfer members are formed to have a width dimension that is the same or substantially the same as the width dimension of the laminated piezoelectric actuator;

a body to which the piezoelectric linear actuator is attached and having formed therein a flow channel;

a valve stem serving also as the output part; and a valve element opening and closing the flow channel by operating the valve stem.

A second aspect of the flow controller according to the present invention is characterized in that in the first aspect of the flow controller, the lower-side inner peripheral edge portion of each of the guide holes of the pair of displacement transfer members serves as a locking part to which each of the arms of the output part is locked, and, in the lower surface of each of the arm parts of the output part, a locking groove having the same shape as the locking part and detachably fitted with the locking part and positioned is formed.

A third aspect of the flow controller according to the present invention is characterized in that in the second aspect of the flow controller, the locking parts and the locking grooves have arc shapes that are located on the circumference of a common circle in plan view.

A fourth aspect of the flow controller according to the present invention is characterized in that in the first aspect of the flow controller, the flow controller further includes a bonnet to which the lower support member is coupled, the bonnet having formed therein:

a concave portion receiving the lower end portions of the pair of displacement transfer members, an upper portion of the cylindrical part, the pair of arm parts, and an elastic body; and a through-hole into which a lower portion of the cylindrical part is slidably inserted.

A fifth aspect of the flow controller according to the present invention is characterized in that in the fourth aspect of the flow controller, the output part is slidably supported by the through-hole through an annular sealing member fitted into an annular groove formed in the lower outer peripheral surface of the cylindrical part.

A sixth aspect of the flow controller according to the present invention is characterized in that in the fourth aspect of the flow controller, the bonnet is formed to have a dimension that is the same or substantially the same as the width dimension of the laminated piezoelectric actuator.

A seventh aspect of the flow controller according to the present invention is characterized in that in the first aspect of the flow controller, the flow controller further includes:

an orifice interposed in the flow channel on the downstream side of the valve element; and a pressure detector detecting the pressure in the flow channel on the upstream side of the orifice, the controller controlling the opening and closing of the piezoelectrically actuated valve based on a value detected by the pressure detector.

An eighth aspect of the flow controller according to the present invention is characterized in that in the first aspect of the flow controller, the flow controller further includes:

an inlet-side block coupled to the body and having an inlet-side flow channel communicating with the flow channel on the upstream side of the body; and an outlet-side block coupled to the body, having an outlet-side flow channel communicating with the flow channel on the downstream side of the body, and also including a pressure detector detecting the pressure in the outlet-side flow channel.

Advantageous Effects of Invention

According to the preset invention, because of the above configuration, structural components are aggregated on the left and right of a laminated piezoelectric actuator, and the structural components are each formed to have a dimension that is the same or substantially the same as the width dimension of the laminated piezoelectric actuator. As a result, the thickness of the piezoelectric linear actuator can be minimized. That is, the piezoelectric linear actuator can be thinned to the width dimension of the laminated piezoelectric actuator. Accordingly, a piezoelectrically actuated valve or flow controller using such a laminated piezoelectric actuator can also be significantly thinned.

DESCRIPTION OF EMBODIMENTS

Figure 1:
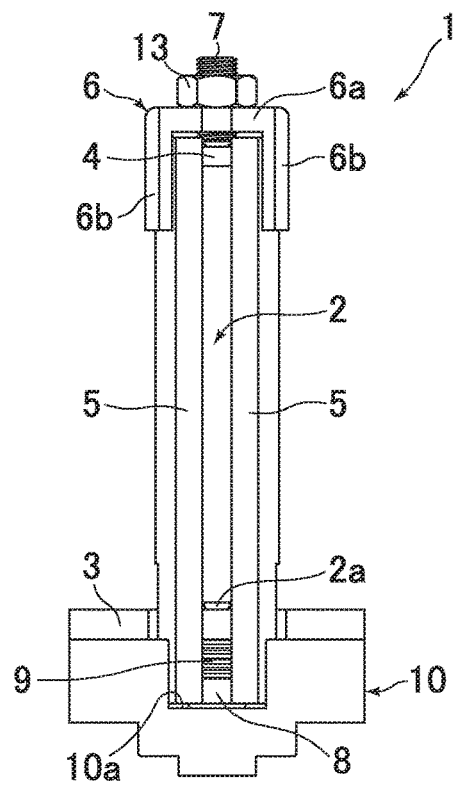
FIG. 1 A front view showing one embodiment of the piezoelectric linear actuator according to the present invention.
Figure 2:
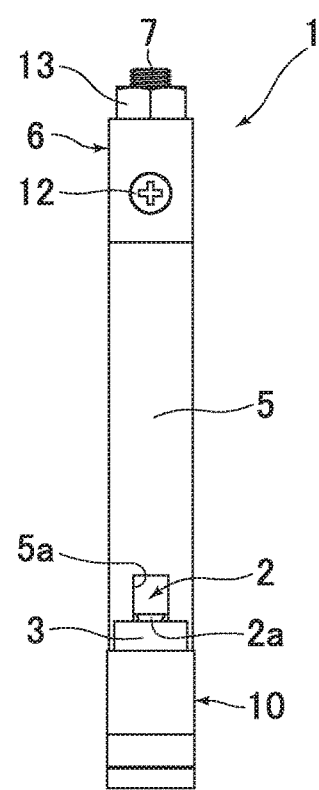
FIG. 2 A side view of the piezoelectric linear actuator.
Figure 3:
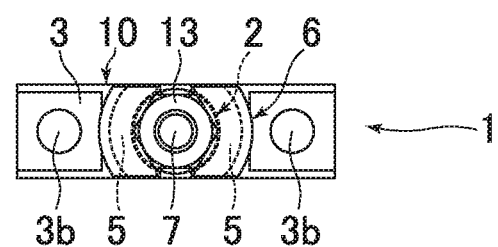
FIG. 3 A plan view of the piezoelectric linear actuator.

Hereinafter, embodiments of the present invention will be described in detail based on the drawings.

FIG. 1 to FIG. 4 show one embodiment of the piezoelectric linear actuator 1 according to the present invention. The piezoelectric linear actuator 1 includes: a laminated piezoelectric actuator 2 having a cylindrical shape; a lower support member 3 supporting the laminated piezoelectric actuator 2 and extending laterally to the left and right of the laminated piezoelectric actuator 2; a pressing member 4 pressing the laminated piezoelectric actuator 2 from above; a pair of displacement transfer members 5 extending along the left and right sides of the laminated piezoelectric actuator 2, respectively, to vertically movably intersect the lower support member 3 and transferring displacement due to the piezoelectric effect of the laminated piezoelectric actuator 2; an upper coupling member 6 coupling upper end portions of the pair of displacement transfer members 5; an adjustment screw 7 provided to the upper coupling member 6 and capable of adjusting the height position of the pair of displacement transfer members 5 relative to the pressing member 4; an output part 8 locked to the pair of displacement transfer members 5 below the lower support member 3 and coupling lower end portions of the displacement transfer members 5; an elastic body 9 interposed between the lower support member 3 and the output part 8 and biasing the output part 8 downward; and a bonnet 10 to which the lower support member 3 is secured.

As the laminated piezoelectric actuator 2, a so-called cylindrical metal-sealed laminated piezoelectric actuator, wherein stacked piezoelectric elements are placed in a cylindrical tubular metallic casing and hermetically sealed, is used. The laminated piezoelectric actuator 2 is configured such that with the expansion/contraction of the piezoelectric elements, a hemispherical projection 2a provided at the tip portion of the casing reciprocates along the longitudinal center of the laminated piezoelectric actuator 2.

Figure 4:
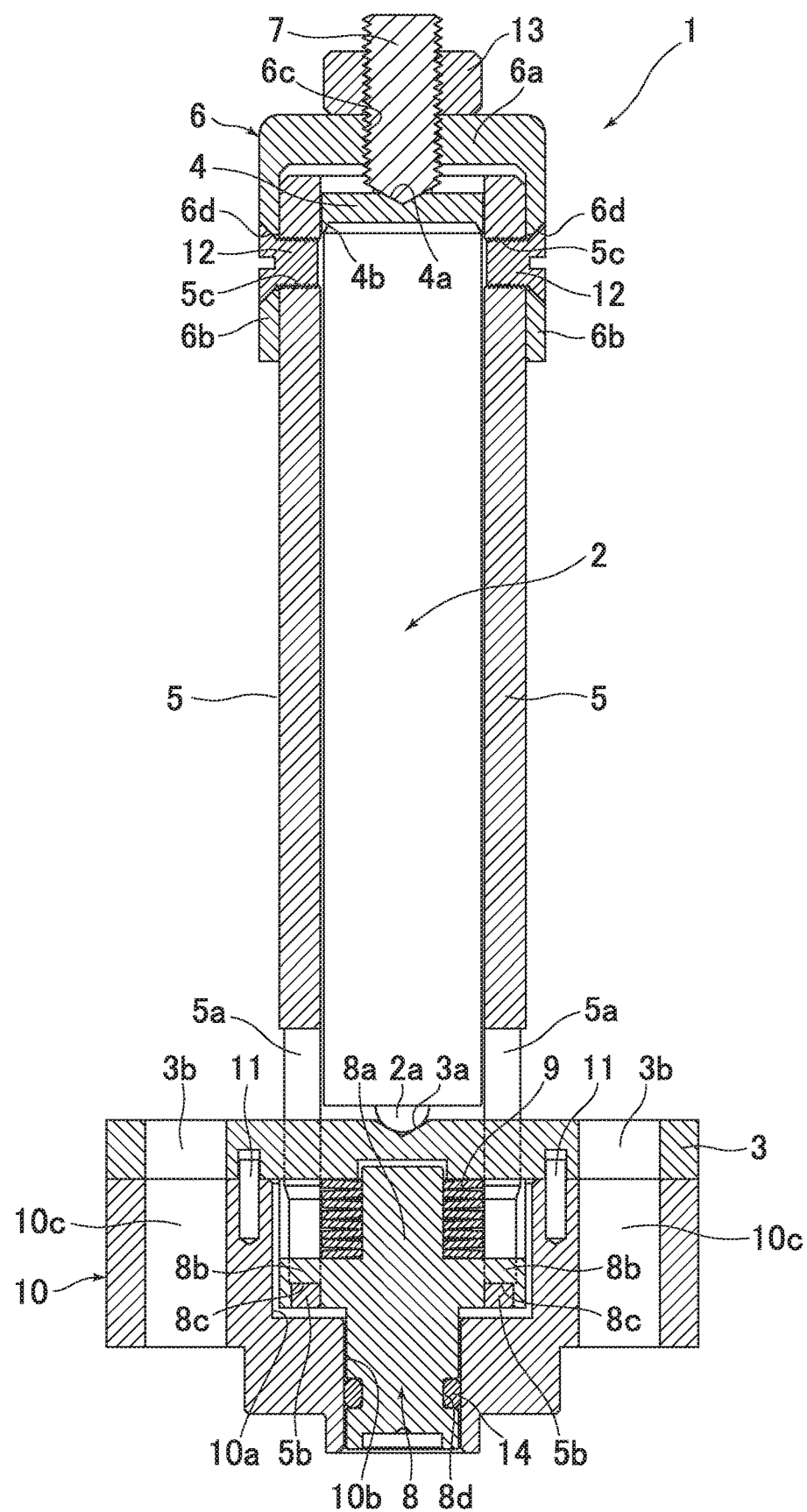
FIG. 4 An enlarged longitudinal-sectional front view of the piezoelectric linear actuator.
Figure 5:
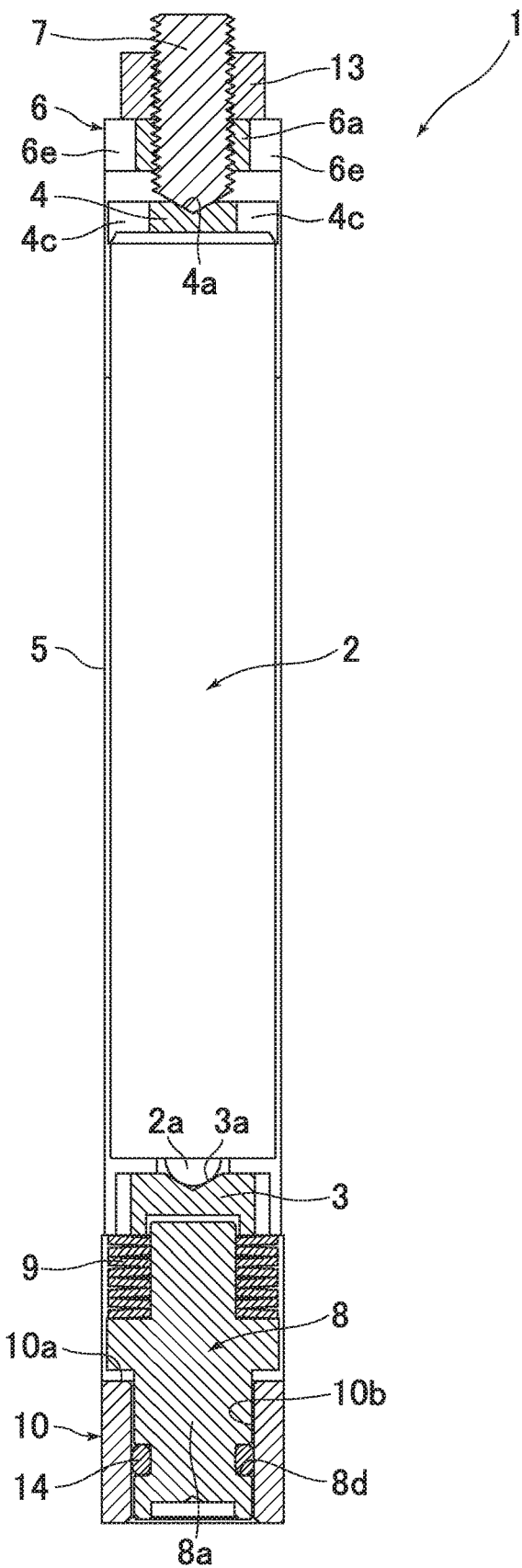
FIG. 5 An enlarged longitudinal-sectional side view of the piezoelectric linear actuator.

The lower support member 3 is made of a metal material, such as a stainless-steel material, in the form of a plate-shaped member having the same or substantially the same width dimension as the width (or diameter) dimension of the laminated piezoelectric actuator 2, and, as shown in FIG. 4, positioned with two straight pins 11 on the bonnet 10. Here, "substantially the same dimension" refers to a dimension within a range of about ±1 mm relative to the width (diameter) dimension of the laminated piezoelectric actuator 2. Hereinafter, "substantially the same dimension" refers to a dimension within the above range of numerical values. In this embodiment, the maximum width dimension of the lower support member 3 is slightly smaller than the width (diameter) dimension of the laminated piezoelectric actuator 2.

In addition, at the center of the upper surface of the lower support member 3, a conical recess 3a is formed, where the hemispherical projection 2a of the laminated piezoelectric actuator 2 is supported and mounted. At the same time, on each of the left and right sides of the lower support member 3, a through-bore 3b, through which a securing bolt is inserted, is formed (see FIG. 6 and FIG. 7).

Figure 6:
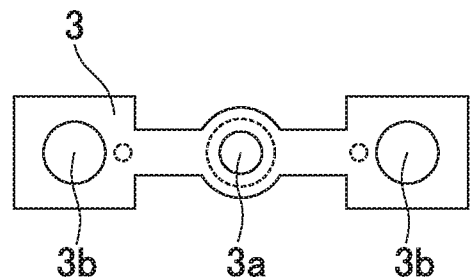
FIG. 6 A plan view of a lower support member, which is a structural component of a piezoelectric linear actuator.
Figure 7:
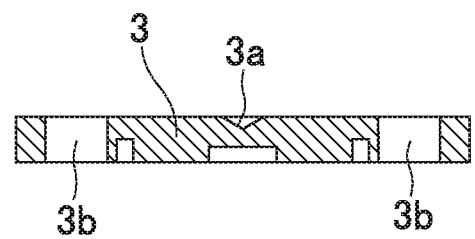
FIG. 7 A longitudinal-sectional front view of the lower support member.

Further, as shown in FIG. 6, the lower support member 3 is configured such that its longitudinal intermediate portion (the portion that intersects the lower end portions of the pair of displacement transfer members 5) is narrower than the end portions. When assembled with the pair of displacement transfer members 5, the lower support member 3 is inserted through the guide holes 5a formed in the lower end portions of the pair of displacement transfer members 5, and then rotated at 90° around the longitudinal axis so as to make the plate surface horizontal.

The pressing member 4 is made of a metal material, such as a stainless-steel material, in the form of a disc-shaped member having the same or substantially the same width (diameter) dimension as the width (diameter) dimension of the laminated piezoelectric actuator 2. At the central position of the upper surface of the pressing member 4, a conical recess 4a, against which the tip of the adjustment screw 7 is pressed and abutted, is formed. At the same time, in the lower surface of the pressing member 4, a dish-shaped recess 4b, into which the upper end of the laminated piezoelectric actuator 2 is tightly fitted, is formed (see FIG. 8 and FIG. 9). In this embodiment, the width (diameter) dimension of the pressing member 4 is slightly larger than the width (diameter) dimension of the laminated piezoelectric actuator 2.

Figure 8:
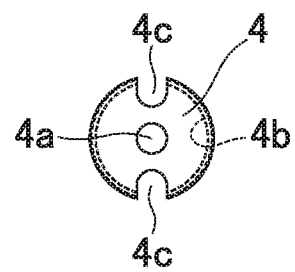
FIG. 8 A plan view of a pressing member, which is a structural component of a piezoelectric linear actuator.
Figure 9:
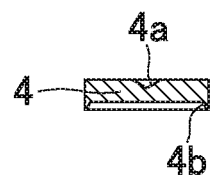
FIG. 9 A longitudinal-sectional front view of the pressing member.

In addition, as shown in FIG. 8, in the outer peripheral edge portion of the pressing member 4, opposed notch grooves 4c for the passage of lead terminals (not shown) of the laminated piezoelectric actuator 2 are formed.

The pair of displacement transfer members 5 are each made of a metal material having a small thermal expansion coefficient, such as an invar material, in the form of an elongated member having an arc-shaped inner peripheral surface along the outer peripheral surface of the laminated piezoelectric actuator 2 and parallel side surfaces continuous to the arc-shaped inner peripheral surface.

Figure 10:
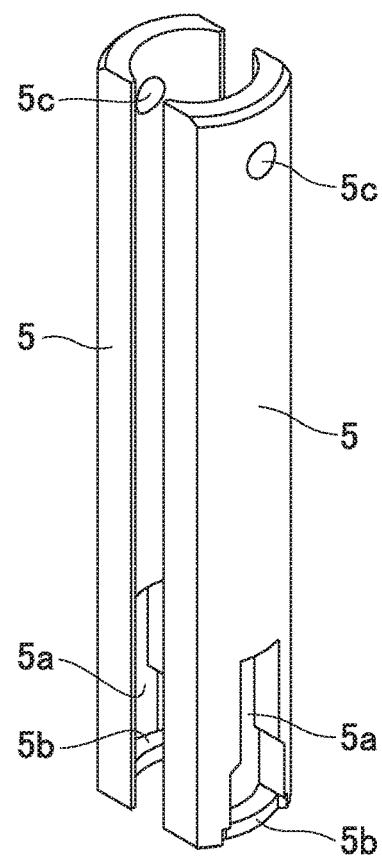
FIG. 10 A perspective view of a pair of displacement transfer members, which is a structural component of a piezoelectric linear actuator.

That is, the configuration of the pair of displacement transfer members 5 is as follows. A metallic cylindrical tubular member sized to surround the laminated piezoelectric actuator 2 is cut at opposed portions in a parallel manner, and the cylindrical tubular member is divided into two parts along the longitudinal direction (see FIG. 10). As a result, the maximum width of the pair of displacement transfer members 5 is the same or substantially the same dimension as the width (diameter) of the laminated piezoelectric actuator 2. In this embodiment, the maximum width dimension of the pair of displacement transfer members 5 is slightly larger than the width (diameter) dimension of the laminated piezoelectric actuator 2.

Figure 11:
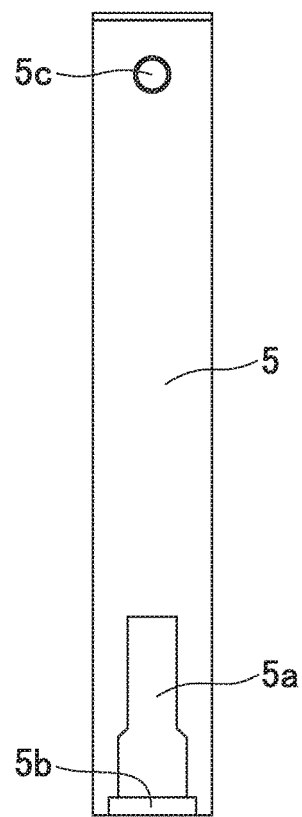
FIG. 11 A side view of the pair of displacement transfer members.
Figure 12:
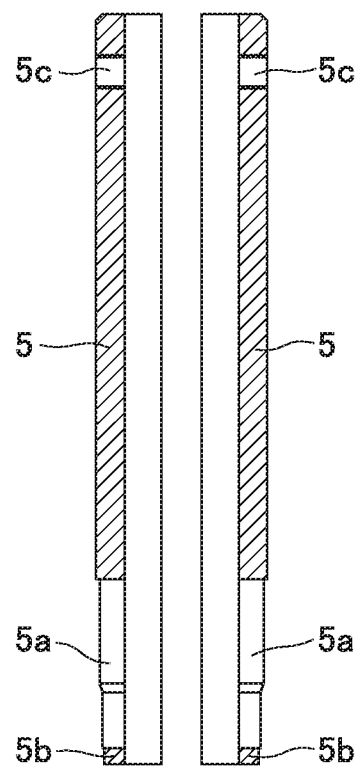
FIG. 12 A longitudinal-sectional front view of the pair of displacement transfer members.

In addition, in the lower end portion of each of the pair of displacement transfer members 5, a vertically long guide hole, through which the lower support member is inserted in a horizontal orientation, is formed in such a manner that the guide holes are in opposed positions. At the same time, a lower-side inner peripheral edge portion of each guide hole 5a serves as a locking part 5b, to which the output part 8 is locked (see FIG. 10 to FIG. 12). The vertically long guide holes 5a are each formed to have a dimension that allows the lower end portions of the displacement transfer members 5 to vertically move relative to the lower support member 3. In addition, the locking part 5b is formed in an arc shape in plan view.

Further, in the upper end portions of the pair of displacement transfer members 5, opposed female screw holes 5c for securing the upper coupling member 6 with a setscrew 12 are formed.

The upper coupling member 6 is made of a metal material, such as a stainless-steel material, in the form of an approximately inverted U-shaped member having the same or substantially the same width dimension as the width (diameter) dimension of the laminated piezoelectric actuator 2, and includes a flat plate part 6a facing the pressing member 4 and a pair of arc parts 6b formed continuous to both ends of the flat plate part 6a. The arc parts 6a each come in area contact with the outer peripheral surface of the upper end portion of each of the pair of displacement transfer members 5 (see FIG. 13 and FIG. 14). In this embodiment, the maximum width dimension of the upper coupling member 6 is slightly larger than the width (diameter) dimension of the laminated piezoelectric actuator 2.

In addition, at the central position of the flat plate part 6a of the upper coupling member 6, a female screw hole 6c, into which the adjustment screw 7 is vertically movably screwed and attached, is formed. At the same time, in the pair of arc parts 6b of the upper coupling member 6, opposed through-holes 6d are formed (see FIG. 13).

Figure 13:
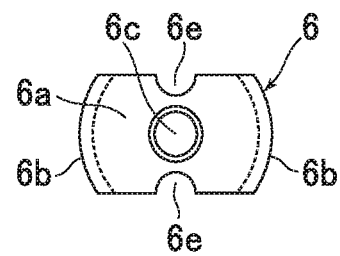
FIG. 13 A plan view of an upper coupling member, which is a structural component of a piezoelectric linear actuator.
Figure 14:
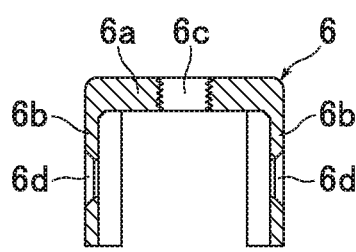
FIG. 14 A longitudinal-sectional front view of the upper coupling member.

Further, as shown in FIG. 13, in both side surfaces of the flat plate part 6a of the upper coupling member 6, opposed notch grooves 6e that match with the notch grooves 4c for the passage of lead terminals (not shown) of the laminated piezoelectric actuator 2 are formed.

Then, the upper coupling member 6 is placed to cover the upper end portions of the pair of displacement transfer members 5, and the setscrew 12 inserted through the through-holes 6d of the upper coupling member 6 is tightened into the female screw holes 5c of the pair of displacement transfer members 5; as a result, the upper end portions of the pair of displacement transfer members 5 can be coupled. In addition, the adjustment screw 7 is screwed and inserted into the female screw hole 6c of the upper coupling member 6, the tip of the adjustment screw 7 is abutted to the conical recess 4a of the pressing member 4. By adjusting the tightening degree of the adjustment screw 7, the height position of the pair of displacement transfer members 5 relative to the pressing member 4 can be adjusted. The adjustment screw 7 has a locking nut 13 screwed and attached thereto.

Figure 15:
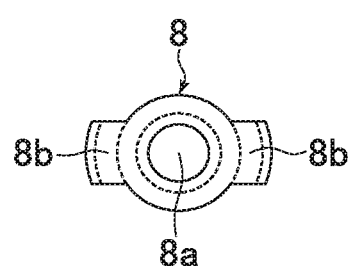
FIG. 15 A plan view of an output part, which is a structural component of a piezoelectric linear actuator.

The output part 8 is made of a metal material, such as a stainless-steel material, and includes a cylindrical part 8a whose upper end portion is inserted between the lower end portions of the pair of displacement transfer members 5 and a pair of arm parts 8b formed on the intermediate outer peripheral surface of the cylindrical part 8a to protrude along the lower support member 3. The arm parts 8b are each locked to the locking part 5b of each of the pair of displacement transfer member 5 (see FIG. 15 to FIG. 17). The maximum width (maximum diameter) dimension of the cylindrical part 8a of the output part 8 is the same or substantially the same as the width (diameter) dimension of the laminated piezoelectric actuator 2. In this embodiment, the maximum width (maximum diameter) dimension of the cylindrical part 8a of the output part 8 is slightly smaller than the width (diameter) dimension of the laminated piezoelectric actuator 2.

Figure 16:
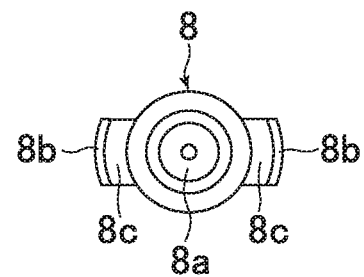
FIG. 16 A bottom view of the output part.
Figure 17:
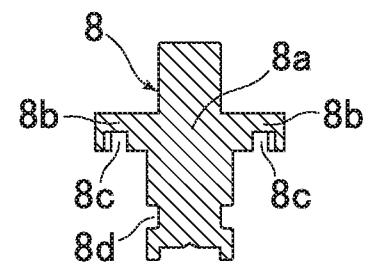
FIG. 17 A longitudinal-sectional front view of the output part.

In addition, as shown in FIG. 16 and FIG. 17, in the lower surface of each arm part 8b of the output part 8, a locking groove 8c having the same arc shape as the locking parts 5b of the pair of displacement transfer members 5 and detachably fitted with each locking part 5b and positioned is formed. The locking parts 5b of the pair of displacement transfer members 5 and the locking grooves 8c of the output part 8 are located on the circumference of a common circle in plan view.

Further, in the lower outer peripheral surface of the cylindrical part 8a of the output part 8, as shown in FIG. 17, an annular groove 8d is formed to receive an annular sealing member 14 (e.g., O-ring).

Then, the upper end portion of the cylindrical part 8a of the output part 8 is inserted between the lower end portions of the pair of displacement transfer members 5, and the locking grooves 8c of the pair of arm parts 8b are locked to the locking parts 5b of the pair of displacement transfer members 5, respectively; as a result, the lower end portions of the pair of displacement transfer members 5 can be coupled. Like this, by simply locking the locking grooves 8c of the output part 8 with the locking parts 5b of the pair of displacement transfer members 5, the lower end portions of the both displacement transfer members 5 can be positioned and coupled. Accordingly, the lower end portions of the pair of displacement transfer members 5 can be coupled easily in a simple manner.

The elastic body 9 is interposed between the lower support member 3 and the output part 8 while being fitted around the upper end portion of the cylindrical part 8a of the output part 8, and biases the output part 8 and the pair of displacement transfer members 5 downward. In this embodiment, as the elastic body 9, a plurality of disc springs formed to have a diameter dimension that is the same or substantially the same as the width (diameter) dimension of the laminated piezoelectric actuator 2 are used. Because of the elastic force of the disc springs, the pair of displacement transfer members 5 are strongly pressed, whereby the laminated piezoelectric actuator 2 is pressed through the pressing member 4 and the like against the lower support member 3. As a result, the laminated piezoelectric actuator 2 and the pair of displacement transfer members 5 can be prevented from moving.

The bonnet 10 is made of a metal material, such as a stainless-steel material, in the form of a horizontally long plate-shaped member having the same or substantially the same width dimension as the width (diameter) dimension of the laminated piezoelectric actuator 2, and the two straight pins 11 are provided in the upper end portion. In this embodiment, the maximum width dimension of the bonnet 10 is slightly larger than the width (diameter) dimension of the laminated piezoelectric actuator 2. Incidentally, the two straight pins 11 may be omitted.

Figure 18:
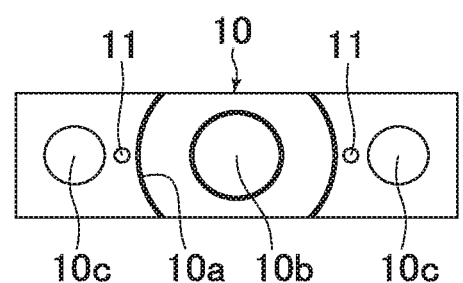
FIG. 18 A plan view of a bonnet, which is a structural component of a piezoelectric linear actuator.
Figure 19:
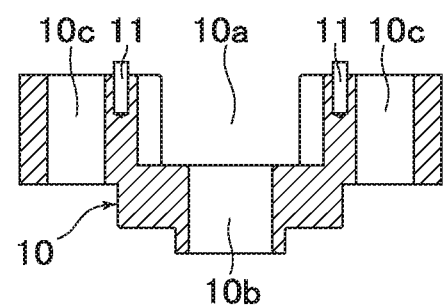
FIG. 19 A longitudinal-sectional front view of the bonnet.

In addition, the bonnet 10 includes a concave portion 10a, which receives the lower end portions of the pair of displacement transfer members 5, the upper portion of the cylindrical part 8a of the output part 8, the pair of arm parts 8b of the output part 8, and the elastic body 9, and a through-hole 10b, into which the lower portion of the cylindrical part 8a of the output part 8 is vertically movably inserted (see FIG. 18 and FIG. 19). In the through-hole 10b, the lower end portion of the cylindrical part 8a of the output part 8 is supported in a manner that allows for vertical storage through the sealing member 14.

Further, on each of the left and right sides of the bonnet 10, a through-bore 10c, which matches with each through-bore 3b of the lower support member 3 and through which a securing bolt is inserted, is formed.

In the piezoelectric linear actuator 1 thus configured, by applying a voltage to the laminated piezoelectric actuator 2, the laminated piezoelectric actuator 2 expands and uplifts the pressing member 4, the upper coupling member 6, and the pair of displacement transfer members 5 against the elastic force of the elastic body 9, whereby the output part 8 is raised. In addition, by shutting down the applied voltage, the pressing member 4, the upper coupling member 6, and the pair of displacement transfer members 5 return to the former position because of the elastic force of the elastic body 9, and the output part 8 also comes down and returns to the former position.

In the piezoelectric linear actuator 1 described above, the lower support member 3, the pressing member 4, the pair of displacement transfer members 5, the upper coupling member 6, the adjustment screw 7, the output part 8, the elastic body 9, and the bonnet 10 are each formed to have a dimension that is the same or substantially the same as the width dimension of the laminated piezoelectric actuator 2. Accordingly, significant thinning of the piezoelectric linear actuator 1 itself has been achieved. The width dimension of the piezoelectric linear actuator 1 can be reduced to half or less that of a conventional piezoelectric linear actuator 1.

Figure 20:
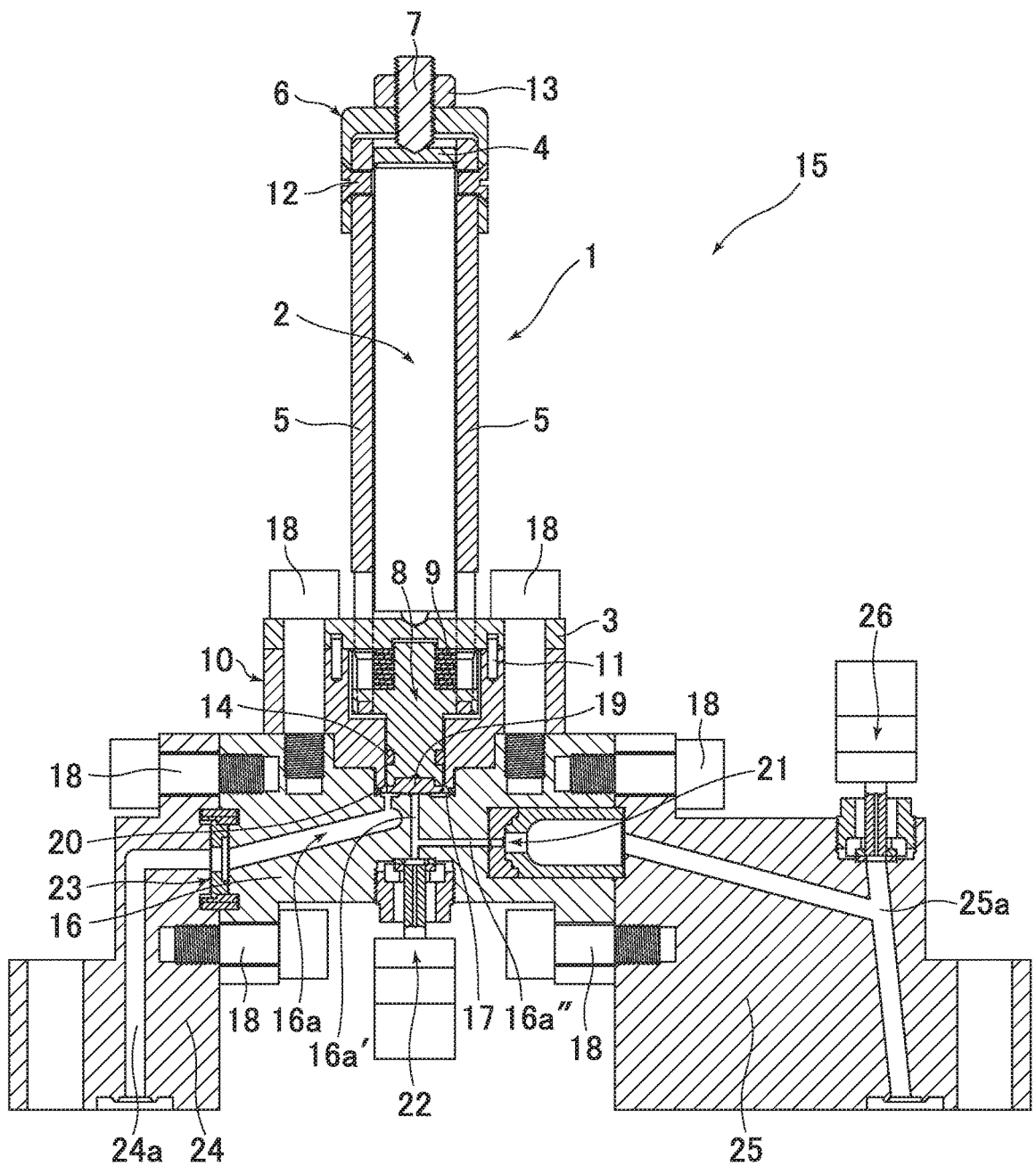
FIG. 20 A longitudinal-sectional front view showing one embodiment of the flow controller according to the present invention.
Figure 21:
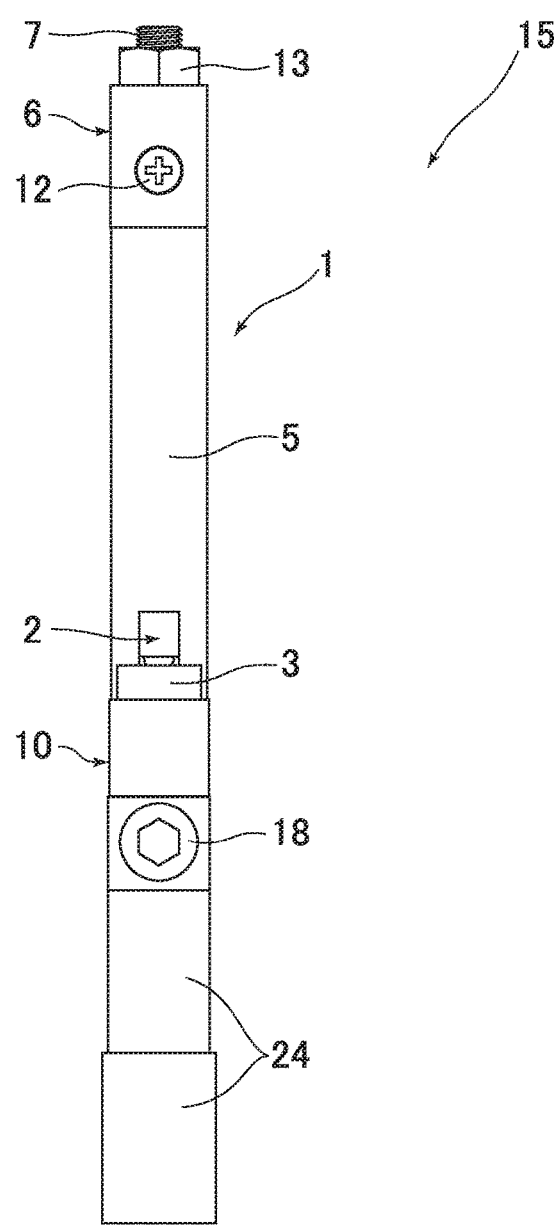
FIG. 21 A side view of the flow controller.
Figure 22:
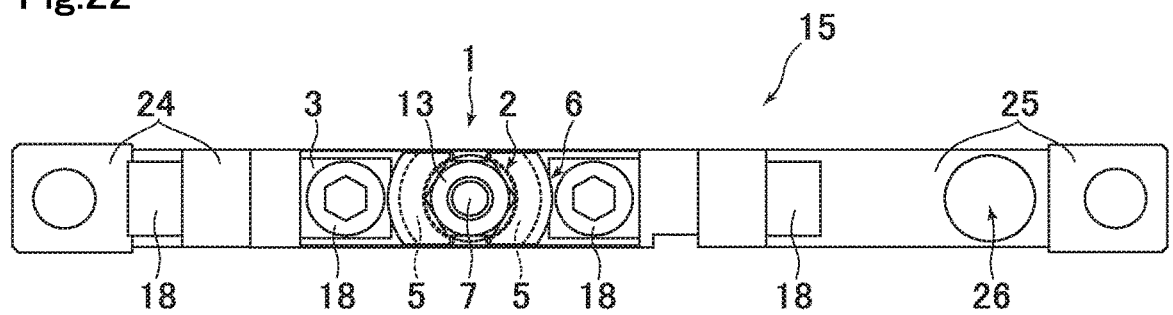
FIG. 22 A plan view of the flow controller.
Figure 23:
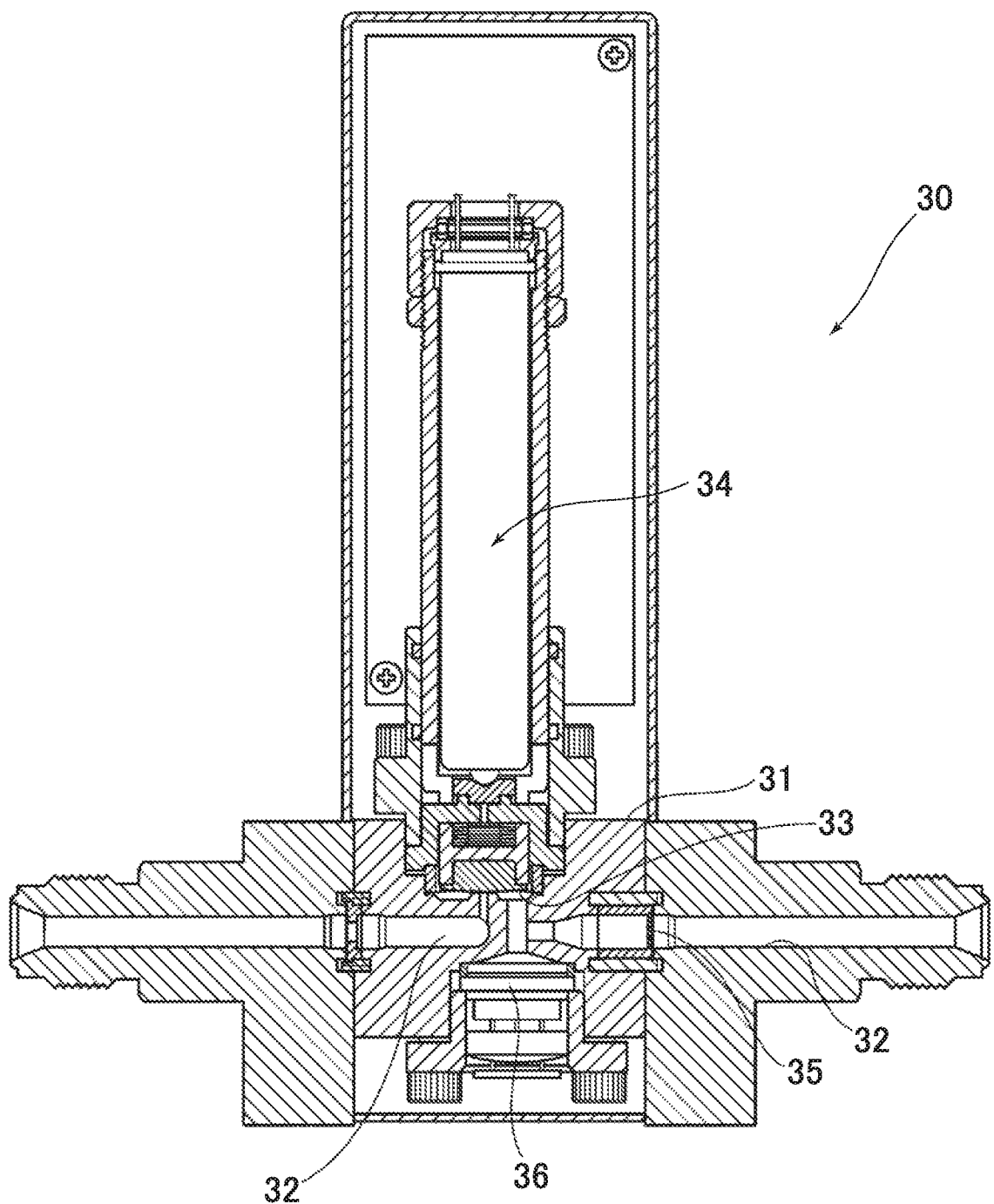
FIG. 23 A longitudinal-sectional front view showing a conventional pressure-type flow controller.

FIG. 20 to FIG. 22 show a flow controller equipped with the piezoelectric linear actuator 1 thus configured. The example shown in FIG. 20 to FIG. 22 is a pressure-type flow controller 15. The basic configuration of the pressure-type flow controller 15 is the same as before, so the detailed description will be suitably omitted.

The pressure-type flow controller 15 includes a piezoelectrically actuated valve. The piezoelectrically actuated valve includes a body 16 to which the piezoelectric linear actuator 1 is attached and having formed therein a flow channel 16, a valve stem serving also as the output part 8 of the piezoelectric linear actuator 1, and a valve element 17 opening and closing the flow channel 16a of the body 16 by operating the valve stem serving also as the output part 8.

The piezoelectric linear actuator 1 is attached and secured to the bonnet 10 by inserting a securing bolt 18 through the through-bores 3b,10c formed in the lower support member 3 and the bonnet 10, and screwing the tip portion of each securing bolt 18 to the body 16. In addition, at the tip of the output part 8 forming the valve stem, a valve element presser 19 made of a synthetic resin for pressing the valve element 17 is attached. Further, the valve element 17 is a metal diaphragm valve element, and its outer peripheral edge portion is hermetically pressed and secured to the body 16 side by the lower end of the bonnet 10 and an annular pressing adapter 20.

In addition, the pressure-type flow controller 15 includes: an orifice 21 (in this embodiment, a gasket-type orifice) interposed in the flow channel 16a on the downstream side of the valve element 17; an upstream-side pressure detector 22 detecting the pressure in the flow channel 16a on the upstream side of the orifice 21; an inlet-side block 24 coupled to the body 16 through a sealing gasket 23 by a securing bolt 18 and having an inlet-side flow channel 24a communicating with the flow channel 16a on the upstream side of the body 16; an outlet-side block 25 coupled to the body 16 by a securing bolt 18, having an outlet-side flow channel 25a communicating with the flow channel 16a on the downstream side of the body 16, and also including a downstream-side pressure detector 26 detecting the pressure in the outlet-side flow channel 25a; and a controller (not shown) controlling the opening and closing of the piezoelectrically actuated valve based on values detected by the pressure detectors 22,26.

For securing the inlet-side block 24 to the body 16, two securing bolts 18 are used. One securing bolt 18 is inserted from the inlet-side block 24 side, while the other securing bolt 18 is inserted from the body 16 side (see FIG. 20). Like this, the two securing bolts 18 are used in an opposed configuration, thereby keeping the securing bolts 18 from interfering with the inlet-side flow channel 24a.

Similarly, for securing the outlet-side block 25 to the body 16, two securing bolts 18 are used. One securing bolt 18 is inserted from the outlet-side block 25 side, while the other securing bolt 18 is inserted from the body 16 side (see FIG. 20). Like this, the two securing bolts 18 are used in an opposed configuration, thereby keeping the securing bolts 18 from interfering with the outlet-side flow channel 25a.

In addition, the sealing gasket 23 may be a simple gasket, or may also be a gasket-type filter that also has a filtering function. In order to ensure the gas flow, the gasket-type filter having a filtering function cannot be downsized too much (its outer diameter cannot be reduced too much). Therefore, in the case where the gasket-type filter is used, the outer peripheral edge portion of the gasket-type filter is cut at opposed portions in a parallel manner so that the width (diameter) of the cut portions of the gasket-type filter falls within the range of the width dimension of the body 16 and the inlet-side block 24. As a result, even when a gasket-type filter is used, overall thinning of the pressure-type flow controller 15 can be achieved.

Further, in the pressure-type flow controller 15, the piezoelectrically actuated valve and the upstream-side pressure detector 22 are disposed to face the body 16, while the gasket-type orifice 21 is disposed orthogonal to the piezoelectrically actuated valve. Thus, the valve element 17 of the piezoelectrically actuated valve and the upstream-side pressure detector 22 are disposed as close as possible to each other, while the gasket-type orifice 21 is disposed as close as possible to the piezoelectrically actuated valve side.

Then, the flow channel 16a formed in the body 16 includes a vertical channel section 16a' connected to the upstream-side pressure detector 22 and a horizontal channel section 16a" connecting the vertical channel section 16a' and the gasket-type orifice 21. With respect to the vertical channel section 16a' and horizontal channel section 16a", in order to make the internal volume thereof as small as possible, it is preferable that the inner diameter thereof is as small as possible. In this embodiment, the vertical channel section 16a' and horizontal channel section 16a" each have a circular cross-sectional shape with an inner diameter of 0.5 mm to 1.0 mm. As a result, the internal volume of the flow channel 16a between the valve element 17 of the piezoelectrically actuated valve and the gasket-type orifice 21 can be reduced to approximately half or less compared with a conventional pressure-type flow controller, and the step-down characteristics of the pressure-type flow controller 15 can be improved.

The body 16, the pressure detectors 22,26, the inlet-side block 24, and the outlet-side block 25 are each designed to have substantially the same width as the laminated piezoelectric actuator 2.

In the pressure-type flow controller 15 shown in FIG. 20 to FIG. 22, the body 16, the pressure detectors 22,26, the inlet-side block 24, and the outlet-side block 25 are each formed to have substantially the same width as the laminated piezoelectric actuator 2. As a result, overall thinning of the controller has been achieved.

In the above embodiment, a pressure-type flow controller 15 has been described. However, this is also applicable to other flow controllers utilizing the laminated piezoelectric actuator 2 of the present invention.

REFERENCE SIGNS LIST

1: Piezoelectric linear actuator
2: Laminated piezoelectric actuator

2a: Hemispherical projection
3: Lower support member
3a: Conical recess
3b: Through-bore
4: Pressing member
4a: Conical recess
4b: Dish-shaped recess
4c: Notch groove
5: Displacement transfer member
5a: Guide hole
5b: Locking part
5c: Female screw hole
6: Upper coupling member
6a: Flat plate part
6b: Arc part
6c: Female screw hole
6d: Through-hole
6e: Notch groove
7: Adjustment screw
8: Output part
8a: Cylindrical part
8b: Arm part
8c: Locking groove
8d: Annular groove
9: Elastic body
10: Bonnet
10a: Concave portion
10b: Through-hole
10c: Through-bore
11: Straight pin
12: Setscrew
13: Locknut
14: Sealing member
15: Pressure-type flow controller
16: Body
16a: Flow channel
16a': Vertical channel section
16a": Horizontal channel section
17: Valve element
18: Securing bolt
19: Valve element presser
20: Pressing adapter
21: Orifice
22: Upstream-side pressure detector
23: Gasket
24: Inlet-side block
24a: Inlet-side flow channel
25: Outlet-side block
25a: Outlet-side flow channel
26: Downstream-side pressure detector

The invention claimed is:

1. A piezoelectric linear actuator comprising:
a laminated piezoelectric actuator having a cylindrical shape;
a lower support member supporting the laminated piezoelectric actuator and extending laterally to the left and right of the laminated piezoelectric actuator;
a pair of displacement transfer members extending along the left and right sides of the laminated piezoelectric actuator, respectively, to slidably intersect the lower support member and transferring displacement due to the piezoelectric effect of the laminated piezoelectric actuator; and
an output part locked to the pair of displacement transfer members below the lower support member and coupling lower end portions of the displacement transfer members,
wherein the displacement transfer members are each in the form of an elongated member having an arc-shaped inner peripheral surface along an outer peripheral surface of the laminated piezoelectric actuator and also having side surfaces continuous to the arc-shaped inner peripheral surface,
in the lower end portion of each of the displacement transfer members, a vertically long guide hole, through which the lower support member is inserted, is formed in such a manner that the guide holes are in opposed positions,
the output part is locked to a lower-side inner peripheral edge portion of each of the guide holes,
the output part includes a cylindrical part having an upper end portion inserted between the lower end portions of the pair of displacement transfer members and a pair of arm parts formed on the outer peripheral surface of the cylindrical part to protrude along the lower support member and each locked to the lower-side inner peripheral edge portion of each of the guide holes of the pair of displacement transfer members, and
the pair of displacement transfer members are formed to have a width dimension that is the same or substantially the same as the width dimension of the laminated piezoelectric actuator.

2. The piezoelectric linear actuator according to claim 1, wherein
the lower-side inner peripheral edge portion of each of the guide holes of the pair of displacement transfer members serves as a locking part to which each of the arms of the output part is locked, and,
in the lower surface of each of the arm parts of the output part, a locking groove having the same shape as the locking part and detachably fitted with the locking part and positioned is formed.

3. The piezoelectric linear actuator according to claim 2, wherein the locking parts and the locking grooves have arc shapes that are located on the circumference of a common circle in plan view.

4. The piezoelectric linear actuator according to claim 1, further comprising a bonnet to which the lower support member is coupled,
the bonnet having formed therein:
a concave portion receiving the lower end portions of the pair of displacement transfer members, an upper portion of the cylindrical part, the pair of arm parts, and an elastic body; and
a through-hole into which a lower portion of the cylindrical part is slidably inserted.

5. The piezoelectric linear actuator according to claim 4, wherein the output part is slidably supported by the through-hole through an annular sealing member fitted into an annular groove formed in the lower outer peripheral surface of the cylindrical part.

6. The piezoelectric linear actuator according to claim 4, wherein the bonnet is formed to have a dimension that is the same or substantially the same as the width dimension of the laminated piezoelectric actuator.

7. A piezoelectrically actuated valve comprising:
a piezoelectric linear actuator including: a laminated piezoelectric actuator having a cylindrical shape; a lower support member supporting the laminated piezoelectric actuator and extending laterally to the left and right of the laminated piezoelectric actuator; a pair of displacement transfer members extending along the left and right sides of the laminated piezoelectric actuator, respectively, to slidably intersect the lower support member and transferring displacement due to the piezoelectric effect of the laminated piezoelectric actuator; and an output part locked to the pair of displacement transfer members below the lower support member and coupling lower end portions of the displacement transfer members, and being configured such that: the displacement transfer members are each in the form of an elongated member having an arc-shaped inner peripheral surface along the outer peripheral surface of the laminated piezoelectric actuator and also having side surfaces continuous to the arc-shaped inner peripheral surface; in the lower end portion of each of the displacement transfer members, a vertically long guide hole, through which the lower support member is inserted, is formed in such a manner that the guide holes are in opposed positions; the output part is locked to a lower-side inner peripheral edge portion of each of the guide holes; the output part includes a cylindrical part having an upper end portion inserted between the lower end portions of the pair of displacement transfer members and a pair of arm parts formed on the outer peripheral surface of the cylindrical part to protrude along the lower support member and each locked to the lower-side inner peripheral edge portion of each of the guide holes of the pair of displacement transfer members; and the pair of displacement transfer members are formed to have a width dimension that is the same or substantially the same as the width dimension of the laminated piezoelectric actuator;
a body to which the piezoelectric linear actuator is attached and having formed therein a flow channel;
a valve stem serving also as the output part of the piezoelectric linear actuator; and
a valve element opening and closing the flow channel by operating the valve stem.

8. The piezoelectrically actuated valve according to claim 7, wherein
the lower-side inner peripheral edge portion of each of the guide holes of the pair of displacement transfer members serves as a locking part to which each of the arms of the output part is locked, and,
in the lower surface of each of the arm parts of the output part, a locking groove having the same shape as the locking part and detachably fitted with the locking part and positioned is formed.

9. The piezoelectrically actuated valve according to claim 8, wherein the locking parts and the locking grooves have arc shapes that are located on the circumference of a common circle in plan view.

10. The piezoelectrically actuated valve according to claim 7, further comprising a bonnet to which the lower support member is coupled,
the bonnet having formed therein:
a concave portion receiving the lower end portions of the pair of displacement transfer members, an upper portion of the cylindrical part, the pair of arm parts, and an elastic body; and
a through-hole into which a lower portion of the cylindrical part is slidably inserted.

11. The piezoelectrically actuated valve according to claim 10, wherein the output part is slidably supported by the through-hole through an annular sealing member fitted into an annular groove formed in the lower outer peripheral surface of the cylindrical part.

12. The piezoelectrically actuated valve according to claim 10, wherein the bonnet is formed to have a dimension that is the same or substantially the same as the width dimension of the laminated piezoelectric actuator.

13. The piezoelectrically actuated valve according to claim 7, wherein the valve element is a metal diaphragm valve element.

14. A flow controller comprising:
a piezoelectrically actuated valve; and
a controller controlling the opening and closing of the piezoelectrically actuated valve,
the piezoelectrically actuated valve including:
a piezoelectric linear actuator including: a laminated piezoelectric actuator having a cylindrical shape; a lower support member supporting the laminated piezoelectric actuator and extending laterally to the left and right of the laminated piezoelectric actuator; a pair of displacement transfer members extending along the left and right sides of the laminated piezoelectric actuator, respectively, to slidably intersect the lower support member and transferring displacement due to the piezoelectric effect of the laminated piezoelectric actuator; and an output part locked to the pair of displacement transfer members below the lower support member and coupling lower end portions of the displacement transfer members, and being configured such that: the displacement transfer members are each in the form of an elongated member having an arc-shaped inner peripheral surface along the outer peripheral surface of the laminated piezoelectric actuator and also having side surfaces continuous to the arc-shaped inner peripheral surface; in the lower end portion of each of the displacement transfer members, a vertically long guide hole, through which the lower support member is inserted, is formed in such a manner that the guide holes are in opposed positions; the output part is locked to a lower-side inner peripheral edge portion of each of the guide holes; the output part includes a cylindrical part having an upper end portion inserted between the lower end portions of the pair of displacement transfer members and a pair of arm parts formed on the outer peripheral surface of the cylindrical part to protrude along the lower support member and each locked to the lower-side inner peripheral edge portion of each of the guide holes of the pair of displacement transfer members; and the pair of displacement transfer members are formed to have a width dimension that is the same or substantially the same as the width dimension of the laminated piezoelectric actuator;
a body to which the piezoelectric linear actuator is attached and having formed therein a flow channel;
a valve stem serving also as the output part; and
a valve element opening and closing the flow channel by operating the valve stem.

15. The flow controller according to claim 14, wherein
the lower-side inner peripheral edge portion of each of the guide holes of the pair of displacement transfer members serves as a locking part to which each of the arms of the output part is locked, and,
in the lower surface of each of the arm parts of the output part, a locking groove having the same shape as the locking part and detachably fitted with the locking part and positioned is formed.

16. The flow controller according to claim 15, wherein the locking parts and the locking grooves have arc shapes that are located on the circumference of a common circle in plan view.

17. The flow controller according to claim 14, further comprising a bonnet to which the lower support member is coupled,
the bonnet having formed therein:
a concave portion receiving the lower end portions of the pair of displacement transfer members, an upper portion of the cylindrical part, the pair of arm parts, and an elastic body; and
a through-hole into which a lower portion of the cylindrical part is slidably inserted.

18. The flow controller according to claim 17, wherein the output part is slidably supported by the through-hole through an annular sealing member fitted into an annular groove formed in the lower outer peripheral surface of the cylindrical part.

19. The flow controller according to claim 17, wherein the bonnet is formed to have a dimension that is the same or substantially the same as the width dimension of the laminated piezoelectric actuator.

20. The flow controller according to claim 14, further comprising:
an orifice interposed in the flow channel on the downstream side of the valve element; and
a pressure detector detecting the pressure in the flow channel on the upstream side of the orifice,
the controller controlling the opening and closing of the piezoelectrically actuated valve based on a value detected by the pressure detector.

21. The flow controller according to claim 14, further comprising:
an inlet-side block coupled to the body and having an inlet-side flow channel communicating with the flow channel on the upstream side of the body; and
an outlet-side block coupled to the body, having an outlet-side flow channel communicating with the flow channel on the downstream side of the body, and also including a pressure detector detecting the pressure in the outlet-side flow channel.

* * * * *